(12) United States Patent
Kim (10) Patent No.: US 6,453,992 B1
(45) Date of Patent: Sep. 24, 2002

(54) TEMPERATURE CONTROLLABLE GAS DISTRIBUTOR

(75) Inventor: Chang-Jae Kim, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/563,525

(22) Filed: May 3, 2000

(30) Foreign Application Priority Data

May 10, 1999 (KR) .......................................... 99-16627

(51) Int. Cl.⁷ .............................................. C23C 16/00
(52) U.S. Cl. ................. 165/206; 165/218; 165/48.1; 165/50; 118/715; 118/724; 118/725; 118/666; 239/132.1; 239/132.3; 239/135; 239/139
(58) Field of Search .................. 118/715, 724, 118/725, 666; 239/132.1, 132.3, 135, 139; 165/206, 218, 48.1, 50

(56) References Cited

U.S. PATENT DOCUMENTS

| | | | | |
|---|---|---|---|---|
| 3,303,873 A | * | 2/1967 | Ringquist | 165/221 |
| 3,351,128 A | * | 11/1967 | Barnd | 165/219 |
| 4,625,678 A | * | 12/1986 | Shioya | 118/724 |
| 5,254,171 A | * | 10/1993 | Hayakawa | 118/724 |
| 5,653,806 A | * | 8/1997 | Van Buskirk | 118/724 |
| 5,935,337 A | * | 8/1999 | Takeuchi | 118/724 |
| 5,948,283 A | * | 9/1999 | Grosshart | 118/724 |
| 5,950,925 A | * | 9/1999 | Fukunaga | 118/715 |

* cited by examiner

Primary Examiner—Richard Bueker
(74) Attorney, Agent, or Firm—Fleshner & Kim, LLP (57) ABSTRACT

The present invention relates to a temperature controllable gas distributor which includes a cover having a first passage between its upper cover and lower cover, a second passage embedded along an edge portion of the upper cover, a first heater installed in the second passage, a support portion welded around the cover, and a distributing plate fixed at a lower portion of the support portion. The distributing plate includes a plurality of nozzles, and a third passage which is a passage of fluid is formed in the interior of the distributing plate 201. Second and third heaters are installed in the third passage. In the gas distribution apparatus according to the present invention, since it is possible to control the temperature of the cover and the distributing plate, namely, the entire portions contacting with gas, an abnormal reaction and liquefaction of a source gas can be prevented. Therefore, when depositing a thin film on the wafer using the gas distribution apparatus, it is possible to prevent a pollution which occurs due to the particles formed on the thin film, and a uniform deposition thickness and a faster deposition speed are obtained. As a result, the reliability of the semiconductor device is enhanced, and the fabrication time is decreased for thereby decreasing the fabrication cost.

32 Claims, 7 Drawing Sheets

TEMPERATURE CONTROLLABLE GAS DISTRIBUTOR

BACKGROUND OF THE INVENTION

1. Field of the Invention

The present invention relates to an apparatus for processing a substrate for a semiconductor wafer or a LCD(Liquid Crystal Display), and in particular to a gas distributor for the above-described apparatus.

2. Description of the Background Art

A semiconductor device or LCD is fabricated by repeatedly performing a process for forming a thin film on a semiconductor wafer or LCD substrate and etching a part of the thin film.

Therefore, the thin film formation process and etching process are important processes for fabricating the semiconductor device and LCD. As a representative method for forming the above-described thin film, a CVD(Chemical Vapor Deposition) method is known, and as a process for etching the thin film, a RIE(Reactive Ion Etching) method is known.

In the chemical vapor deposition process and active ion etching process, a certain gas is filled in the process chamber. A chemical reaction between gases or a chemical reaction between a wafer in the reaction furnace or a substrate material and the gas is performed. Therefore, in the chemical vapor deposition apparatus or active ion etching apparatus, a gas distributor which is capable of uniformly distributing in the direction of a certain destination, namely, the wafer or the substrate at a certain speed and under a pressure is used. The present invention relates to the above-described gas distributor.

In particular, in the chemical vapor deposition apparatus, the gas distributor is an important element for obtaining a good quality thin film which has a uniform thickness on the semiconductor wafer or LCD substrate and does not contain particles. The following conditions are required.

Namely, first, gas must be uniformly distributed over the wafer or substrate, and second, a chemical reaction should be stably performed in the interior of the gas distributor or on the outer surface by obtaining or maintaining an activated energy of the gas before the gas is distributed in the direction of a work stand, on which the wafer is placed, from the gas distributor or after the gas is distributed. Namely, the reaction is guided to occur on a destination material, namely, on the wafer.

In particular, in the MOCVD(Metal Organic Chemical Vapor Deposition) method for depositing the organic metal thin film which is widely used, the temperature stability and uniformity of a source gas are affected by the characteristic of the thin film. However, in the gas distributor of the chemical vapor deposition apparatus which is widely used, it is difficult to obtain a good quality film.

Figure 1:
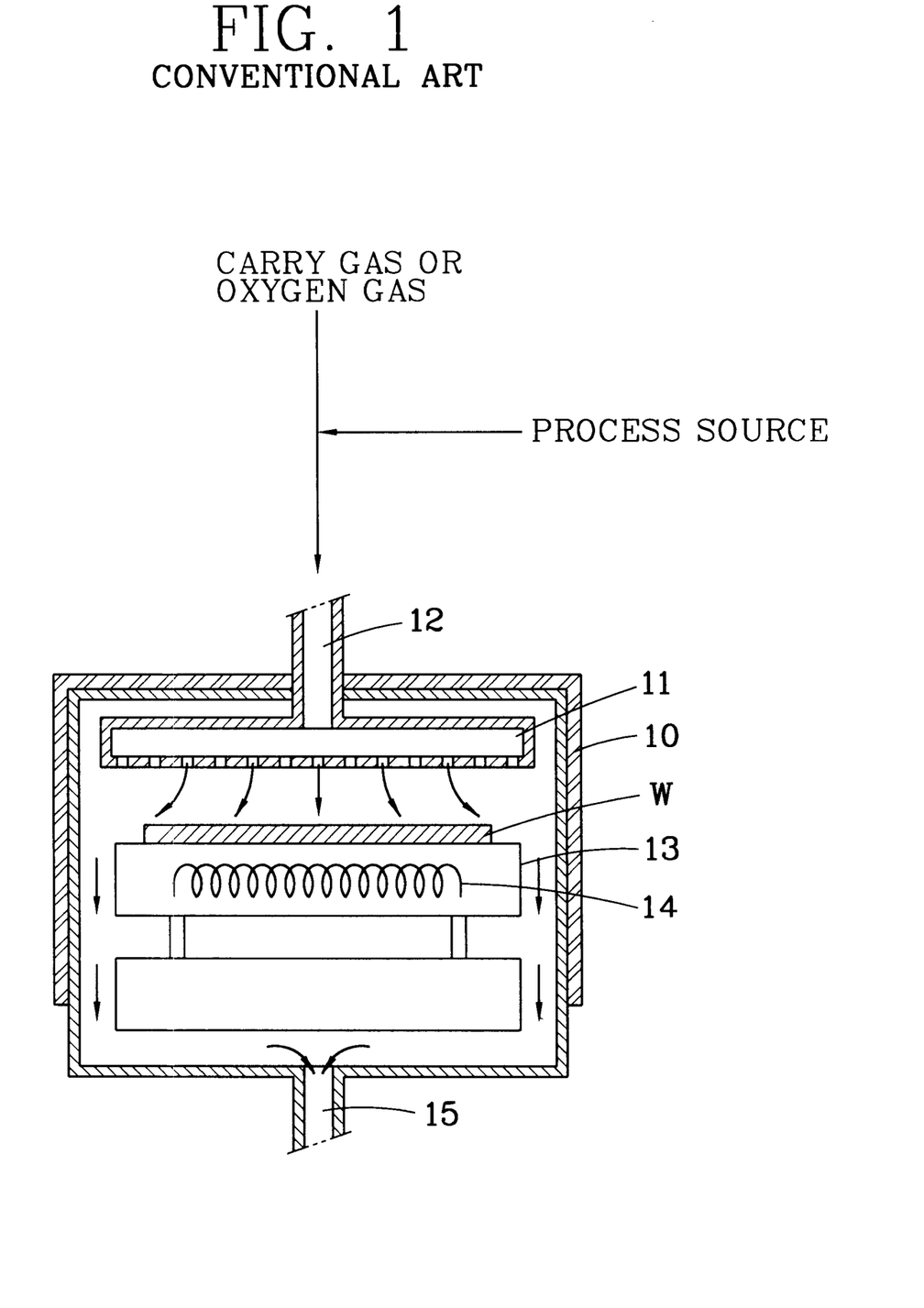
FIG. 1 is a view illustrating a conventional chemical vapor deposition apparatus for forming a certain film.

FIG. 1 is a cross-sectional view illustrating the interior of a reaction furnace of the conventional chemical vapor deposition apparatus. As shown therein, the reaction furnace is surrounded by a cylindrical outer wall 10, and a gas distributor 11 is installed at an upper portion of the cylindrical outer wall 10, and a gas outlet tube 15 is provided at the bottom. A gas inlet tube 12 is provided on the upper surface of the gas distributor 11 through which gas is introduced. A work stand 13 is placed in the interior of the reaction furnace surrounded by the outer wall 10 and below the gas distributor 11. A wafer W is placed on the upper surface of the work stand 13, and a heating apparatus 14 is installed below the work stand. A gas outlet portion 15 is connected at the lower surface of the reaction furnace outer wall 10 for exhausting gas after the reaction is completed.

The principle for forming a thin film on the wafer W using the chemical vapor deposition apparatus of FIG. 1 will be explained. Namely, a source gas or process source is flown into a vaporizer(not shown) in a fluid state for forming a thin film. The thusly flown source gas or process source is mixed with a carry gas formed of $N_2$, $O_2$, Ar, etc. in the vaporizer and is vaporized. Next, the vaporized process source is flown into the gas distributor 11 via the gas inlet port 12 in a gas state and reaches at the wafer via a plurality of nozzles 11a formed at the gas distributor 11 and is chemically reacted based on a heat energy generated by the heating apparatus 14, so that a thin film is formed on the wafer W. At this time, if a heat environment is not proper in the interior of the gas distributor 11, the process gases may be abnormally reacted or the vaporized gas may be liquefied, so that the thin film formed on the wafer W includes particles, whereby the quality of the film may be decreased, and it is impossible to obtain a certain deposition ratio. Therefore, in order to prevent the above-described problems, the temperature in the gas distributor is maintained at a certain degree.

The structure of the conventional gas distributor and the temperature control method will be explained.

Figure 2A:
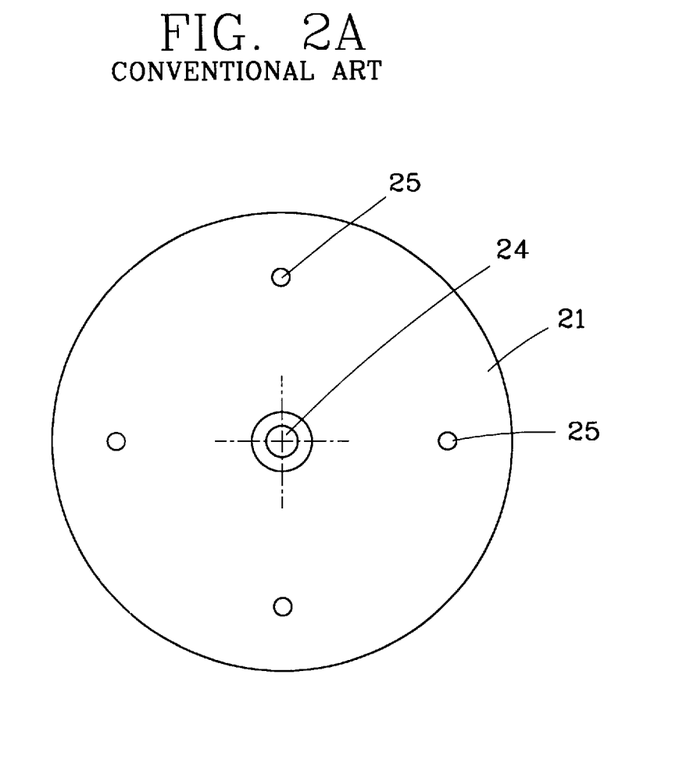
FIGS. 2A and 2B are views illustrating a conventional first type gas distributor.
Figure 2B:
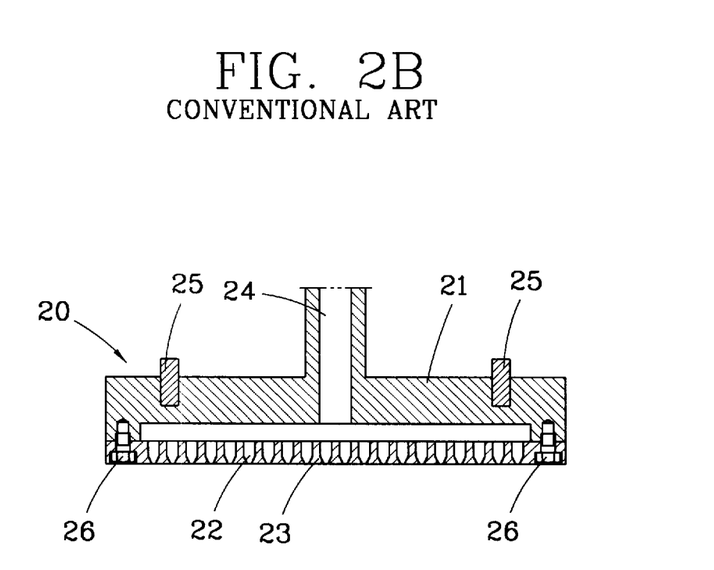

FIG. 2B is a cross-sectional view illustrating a conventional first type gas distributor 20. As shown therein, the gas distributor 20 includes an upper plate 21 and a multiple-hole plate 23 having a plurality of holes or nozzles 22. A gas inlet tube 24 is connected to a center portion of the upper plate 21. The upper plate 21 and the multiple-hole plate 23 are engaged by a plurality of screws 26 along an edge portion. In addition, a heater 25 is installed at an edge portion of the upper plate at an angle of 90°. FIG. 2A is a plan view illustrating the upper surface of the first type gas distributor of FIG. 2B. As shown therein, four heaters 25 are installed at an edge portion of the upper plate 21, and a gas inlet tube 24 is connected to a center portion of the upper plate 24.

Figure 3A:
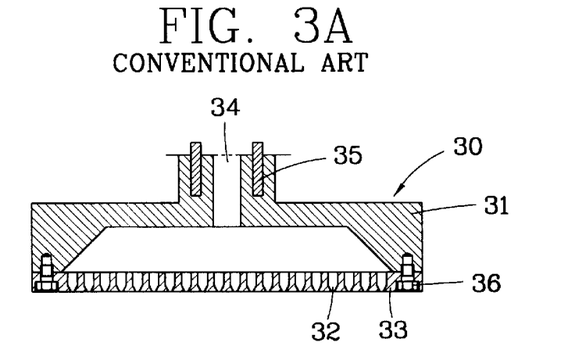
FIGS. 3A through 3C are views illustrating a conventional second type gas distributor.

FIG. 3A is a vertical cross-sectional view illustrating a conventional second type gas distributor. As shown therein, a gas distributor 30 includes an upper plate 31, and a multiple-hole plate 33 having a plurality of holes or nozzles 32. A gas inlet tube 34 is connected to a center portion of the upper plate 31, and the upper plate 31 and the multiple-hole plate 33 are engaged by a plurality of screws 36 along an edge portion. Four heaters 35 are installed at a center portion of the upper plate 31 near the gas inlet tube 34 at a certain interval. The position of the heater is different compared to the first type gas distributor. Namely, the first type heater is formed at an edge portion of the upper plate, and the second type heater is formed at a center portion of the upper plate.

Figure 3B:
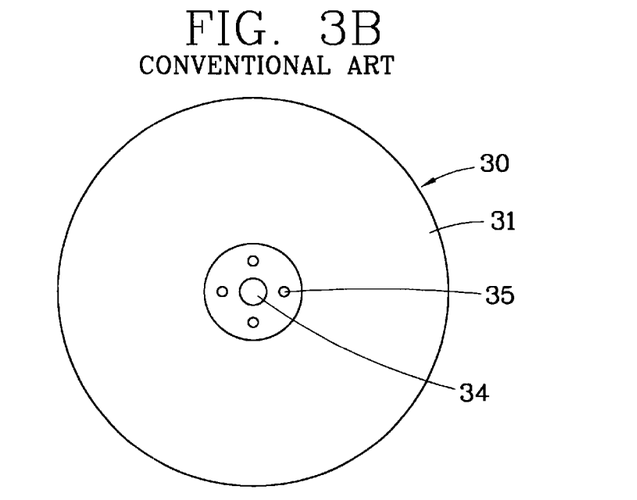

FIG. 3B is a plan view illustrating a second type gas distributor of FIG. 3A. The same elements as FIG. 3A are given the same reference numerals. A gas inlet tube 34 is installed at a center of the upper plate 31, and a heater 35 is installed around the gas inlet tube 34.

Figure 3C:
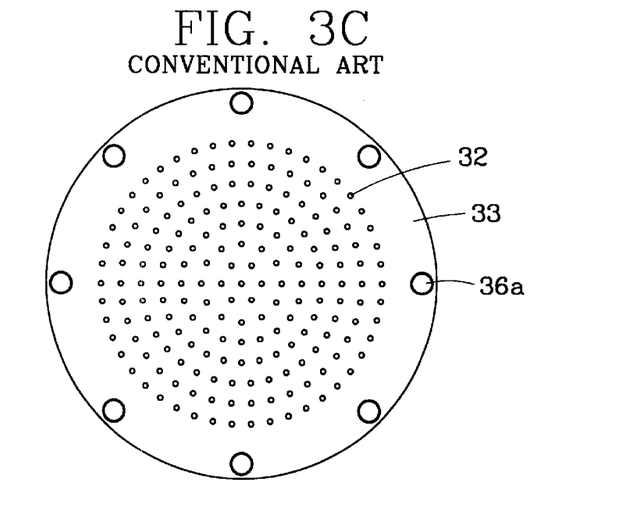

FIG. 3C is a plan view illustrating a multiple-hole plate 33 of the second type gas distributor of FIG. 3A. A plurality of nozzles 32 each having a diameter of 1~2 mm are installed at a certain distance from one another. A plurality of screw holes 36a are formed at an edge portion of the multiple-hole plate 33 for receiving the screws therein.

Figure 4A:
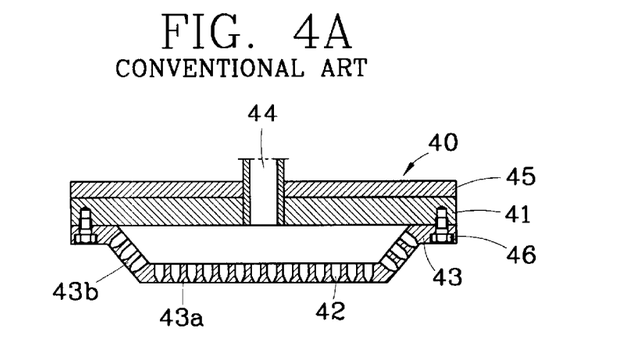
FIGS. 4A through 4C are views illustrating a conventional third type gas distributor.

FIG. 4A is a vertical cross-sectional view illustrating a third type gas distributor 40. As shown therein, the third type gas distributor 40 includes an upper plate 41, a multiple-hole plate 43 having a plurality of nozzles 42, a gas inlet tube 44, and a flat plate heater 45. The upper plate 41 and the multiple-hole plate 43 are engaged by the screws 46. The plate heater 45 is installed on the entire upper portion of the upper plate 41. The multiple-hole plate 43 is formed in a dish shape and has a distributing function capable of distributing a certain gas to an outer portion in the chamber. The multiple-hole plate 43 includes a lower portion 43a and a slant portion 43b.

Figure 4B:
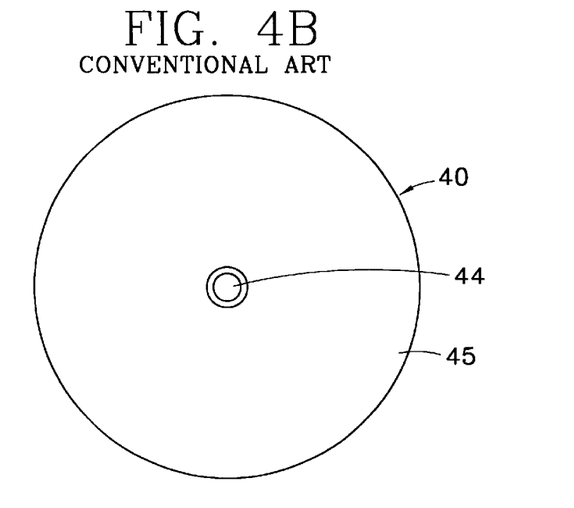
Figure 4C:
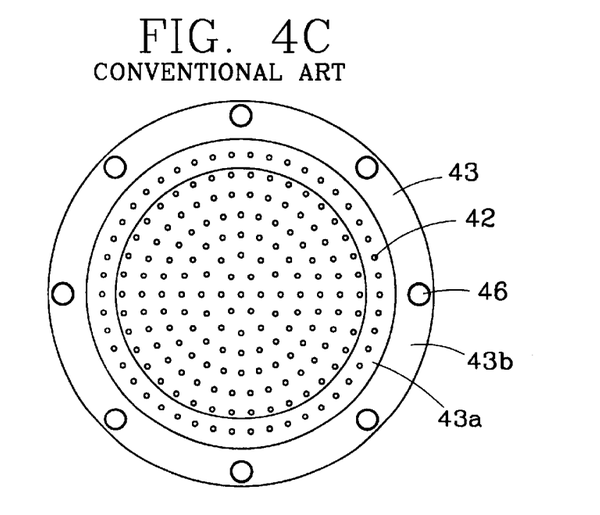

FIG. 4B is a plan view illustrating a third type gas distributor of FIG. 4A. The same elements as FIG. 4A are given the same reference numerals. FIG. 4C illustrates a multiple-hole plate 43. In FIG. 4C, the same reference numerals of FIG. 4C as FIG. 4A correspond to the same elements of FIG. 4A.

The operation of first through third type conventional gas distributors will be explained.

In the first and second gas distributor, a vaporized fluid state gas flown onto the upper plate of the gas distributor via the gas inlet tubes 24 and 34 is heated by four stick-shaped heaters arranged on the upper plate and has a certain degree temperature. The thusly flown gas is uniformly distributed onto the wafer or substrate in the chamber via the nozzles of the multiple-hole plate.

In the third type gas distributor, a slant portion having a slanted degree of about 30° with respect to the horizontal surface at the outer portion of the multiple-hole plate for supplying gas to the edge portion of the wafer or substrate.

The above-described conventional first through third gas distributors have the following problems.

In the first type gas distributor, since the heat is performed by a stick heater installed at an outer portion of the upper plate, the heat is not uniformly transferred to the gas furnace for thereby decreasing a uniformity of the gas temperature. Therefore, the thickness of the film formed on the wafer is not uniform. In addition, it is difficult to obtain a film having a uniform composition, so that a film growth efficiency is decreased. Since the nozzle of the multiple-hole plate is a linear type, a vortex flow is formed at the gas outlet portion of the nozzle. Since the distribution range is small, the gas reaction effect is decreased. In addition, the outer portion becomes a dead space, the particles may be formed. The second type gas distributor has the same disadvantages as the first type gas distributor.

In the third type gas distributor, since the gas is distributed toward the wall of the chamber via the slant portion of the multiple-hole plate, so that the distribution loss of the source gas is increased. At the slant portion, the gas flow is bad. Since the nozzle wall is linear, the particles may be formed. Since the outer portion of the multiple-hole plate directly contacts with the plate heater, the heat is directly transferred from the heater. Since the center portion of the multiple-hole plate is heated by a radiant heat from the plate heater, a non-uniformity of the film thickness occurs due to a difference between the temperature of the gas flowing via the nozzle installed at the center portion of the multiple-hole plate and the temperature of the gas flowing via the nozzle at the edge portion of the multiple-hole plate.

SUMMARY OF THE INVENTION

Accordingly, it is an object of the present invention to provide a temperature controllable gas distributor which is capable of obtaining a good quality thin film and increasing a thin film deposition ratio by preventing an earlier reaction in the interior of the gas distributor and a liquefaction of the vaporized gas.

It is another object of the present invention to provide a temperature controllable gas distributor which is capable of distributing a thermally stable gas for obtaining a uniform thickness of a thin film.

It is another object of the present invention to provide a temperature controllable gas distributor which is capable of preventing a particle formation and forming a good quality thin film by improving a linear type nozzle and providing different diameters of upper, intermediate, and lower portions.

To achieve the above objects, there is provided a temperature controllable gas distributor wherein a cover is formed of an upper cover and a lower cover which are welded in such a manner that a first passage is formed between the upper and lower covers for flowing fluid therethrough, and first and second temperature detectors (thermo couplers) are installed in the first passage for detecting a fluid temperature, and an inlet tube for flowing the fluid into the first passage and an outlet tube for flowing the fluid from the first passage to the outside of the cover are formed in the first passage so that the fluid flows the upper cover, and a plurality of nozzles are formed on the distributor plate in such a manner that the gas flows through the distributing plate, and a third passage is formed on the distributor plate for flowing fluid, and the third passage is connected with the fluid inlet tube and the fluid outlet tube.

In the temperature controllable gas distributor according to the present invention, a second passage is formed along an edge portion of an upper cover, and an electric heat wire for the heat is installed at a second passage.

In the temperature controllable gas distributor according to the present invention, an electric heat wire for the heat is installed at a third passage of a distributor plate.

In the temperature controllable gas distributor according to the present invention, the upper portion diameter, intermediate portion diameter and lower portion diameters of the nozzle are different, and the upper portion diameter is largest, and the lower portion diameter is smallest.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The gas distributor according to the present invention will be explained with reference to the accompanying drawings.

Figure 5:
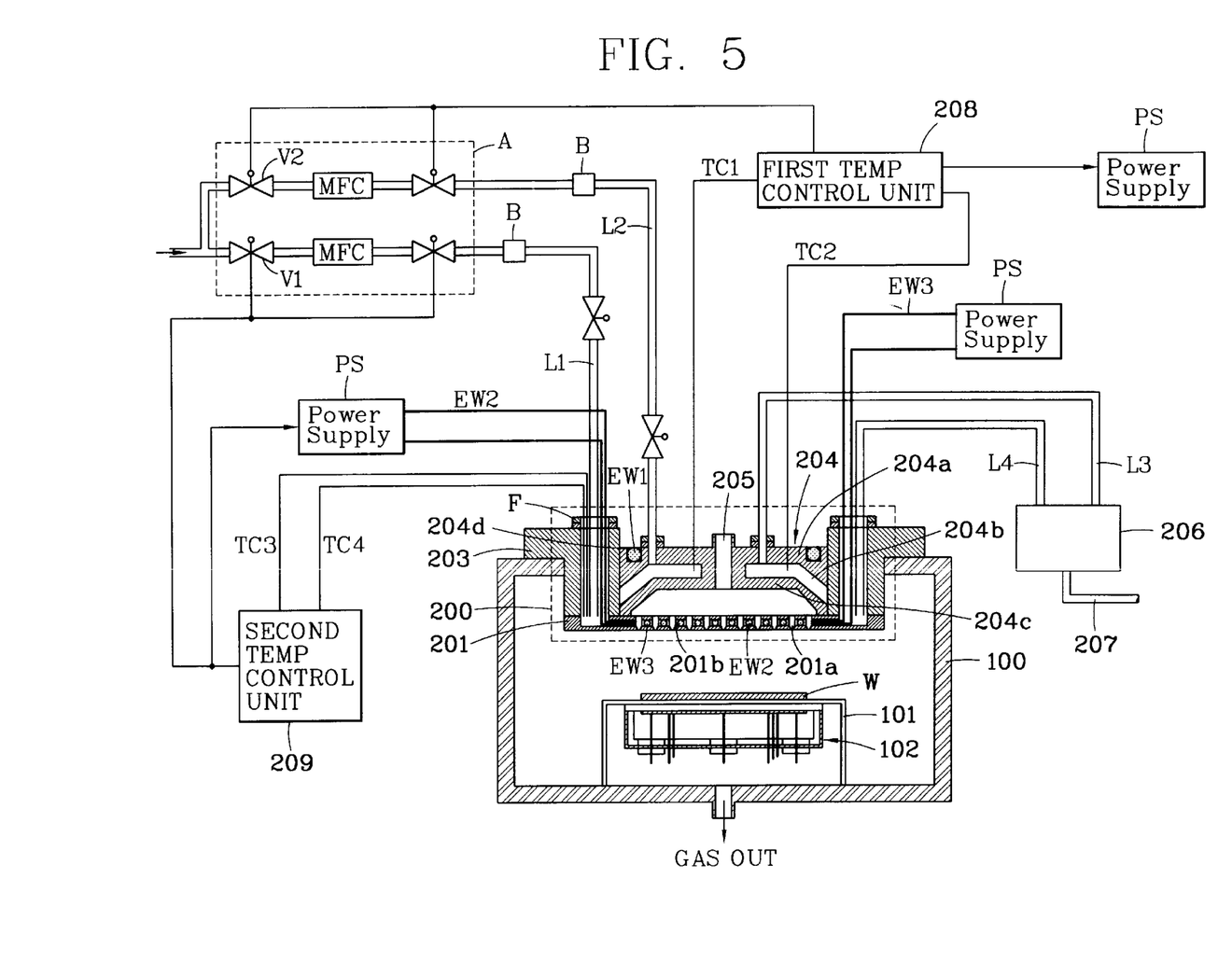
FIG. 5 is a view illustrating a chemical vapor deposition apparatus according to the present invention.

FIG. 5 is a cross-sectional view illustrating a temperature controllable gas distributor and a chamber according to the present invention.

A work stand 101 is provided in the interior of a wall 100 of a cylindrical chamber. A wafer W is disposed on the work stand 101. A heater 102 is installed below the work stand 101 for heating the work stand 101. A gas distributor 200 is installed above the work stand 101. The gas distributor 200 is fixed at an upper portion of the chamber wall 100.

The construction of the gas distributor 200 according to the present invention will be explained in detail.

The gas distributor 200 includes a distributing plate 201 for uniformly distributing gas onto a certain destination, namely, an upper surface of the wafer W at a certain speed and pressure, a support unit 203 engaged with the distributing plate 201 by a screw, etc. and disposed on the upper portion of the chamber wall 100 for fixing the distributing plate 201 at an upper portion of the chamber, and a cover 204 for covering the distributing plate 201. A certain space is formed between the distributing plate 201 and the cover 204 for receiving a vaporized gas therein. A source gas inlet tube 205 is installed at an upper center portion of the cover 204.

The support unit 203 fixes the distributing plate 201 at an upper portion of the chamber. In addition, a passage is formed at the support unit 203 for an installation of a power cable or fluid tubes L1 and L4 or third and fourth temperature detectors TC3 and TC4, which may be thermocouples for supplying an electric power to second and third electric heat wires EW1 and EW2 which are second and third heaters installed at the distributing plate 201. The fluid tubes L1 and L4 are connected with the distributing plate 201 via the passage formed at the support unit 203. A feedthrough F is installed at an entrance of the passage of the support unit 203 for thereby disconnecting the inner and outer portions of the chamber. The second and third heaters EW2 and EW3 receives power from a power supply unit PS installed at the outside of the gas distributor 200. The power supply unit PS is connected with a second temperature controller 209 for receiving a signal from the second temperature controller 209 and supplying power to the second and third heaters EW2 and EW3 and disconnecting the same. The second temperature controller 209 is connected with the third and fourth temperature detectors TC3 and TC4. The temperature detected by the third and fourth temperature detectors TC3 and TC4 and the destination temperature are compared, and a signal is transmitted to the power supply unit PS and the fluid control apparatus A or the fluid temperature control apparatus B.

The cover 204 includes an upper cover 204a and a lower cover 204c. The upper cover 204a and the lower cover 204c are engaged each other, and a space 204b is formed therebetween, so that a certain fluid circulates therein. This space is called as a first passage 204b. The inlet tube L2 for flowing the fluid into the first passage 204c and the outlet tube L3 for discharging the same are connected over the upper cover 204a. A thermocouple which is a first temperature detector TC1 is installed at the inlet tube L2 of the first passage 204b, and a thermocouple which is a second temperature detector TC2 is installed at the outer tube L2, so that it is possible to measure the temperature of the fluid in the first passage 204b. A ring-shaped second passage 204d is embedded along the edge portion of the upper cover 204a for thereby circulating fluid therethrough. An electric wire EW1 which is the first heater EW1 is installed in the interior of the second passage 204d. The first heater EW1 is connected with the power supply unit PS for supplying power.

The first and second temperature detectors TC1 and TC2 are connected with the first temperature controller 208, and the first temperature controller 208 compares the temperature detected by the first and second temperature detectors TC1 and TC2 and transmits a signal to the power supply unit PS, which supply electric power to the fluid control apparatus A or the fluid temperature controller B and the first heater EW1 based on a compared result.

Namely, if the temperature detected by the first and second temperature detectors TC1 and TC2 installed in the first passage 204b is below the destination temperature, the first temperature controller 208 transmits a signal to the fluid controller A or the fluid temperature controller B and controls the fluid controller A or the fluid temperature controller B to flow the heated fluid to the first passage 204c. In addition, the signals is transmitted to the power supply unit PS connected with the first heater EW1, and the power is supplied to the first heater EW1, so that the fluid in the first passage 204b is quickly heated by the first heater EW1 for thereby increasing the temperature of the fluid in the first passage 204b. As a result, the temperature of the cover 204 is increased.

If the temperature detected by the first and second temperature detectors TC1 and TC2 is higher than the destination temperature, the first temperature controller 208 transmits a signal to the power supply unit PS and disconnects the power from the electric heat wire EW1 and transmits a signal to the fluid controller A or the fluid temperature controller B, so that the cooled fluid flows to the outlet tube L3 via the fluid inlet tube L2 and the first passage 204b for thereby maintaining a certain degree temperature of the cover 204 of the gas distributor. At this time, it is needed to maintain a certain degree destination temperature by properly controlling the introduced and discharged fluid amount. The fluid controller A or the fluid temperature controller B which perform the above-described functions are installed at the side of the inlet tube L2. The fluid amount controller A controls the amount of the fluid flown into the first, second and third passages 204b, 204d and 201c of the gas distributor. The fluid temperature controller B heats the fluid and flows into the gas distributor for increasing the temperature of the gas distributor and supplies a cooling fluid for cooling the gas distributor when the same is heated.

In addition, if the distributing plate 201 is over-heated by the heat radiated from the heater 102 below the work stand 101 and exceeds 500° C., the source flown via the distributing plate 201 is previously reacted for thereby forming particles. Therefore, the temperature of the distributing plate 201 is controlled below 500° C. Therefore, in the case that the distributing plate is over-heated, the cooled fluid is circulated using the fluid controller A via the third passage 201b installed in the interior of the distributing plate 201 for thereby decreasing the temperature of the distributing plate. In addition, the fluid temperature controller B may be used instead of the fluid controller A. In the fluid temperature controller, since there are provided a cooling passage and heating passage, in the case that the distributing plate is heated, the cooled fluid is flown via the cooling passage. When it is needed to increase the temperature of the cover of the gas distributor, the heated fluid is flown via the heating passage.

The third flow passage 201b through which the fluid flows in the interior of the distributing plate 201 is formed for controlling the temperature of the distributing plate for preventing an earlier reaction of the source gases and particle formation. The electric wires which are the second and third heaters EW2 and EW3 are installed in the interior of the third passage 201b for heating the fluid. A plurality of nozzles 201a are installed at the distributing plate 201 at a certain interval.

Figure 6A:
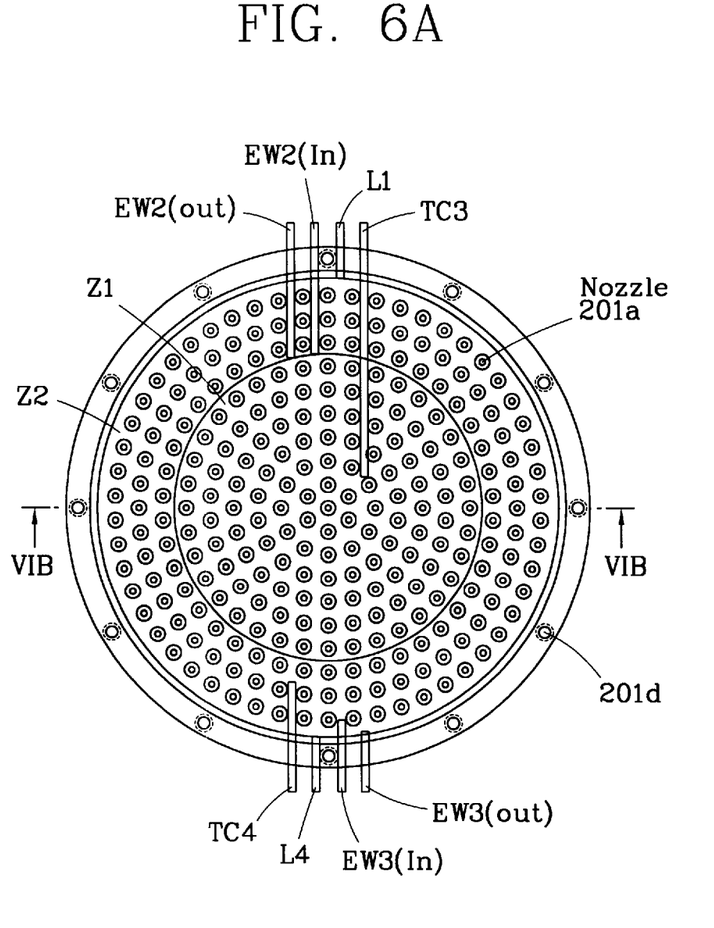
FIG. 6A is a plan view illustrating a distributing plate for a gas distributor according to the present invention.

FIG. 6A is a plan view illustrating the distributing plate 201 according to the present invention.

As shown therein, a plurality of screw holes 201d are formed at an edge portion of the distributing plate 201. The holes 201d are formed to fix the distributing plate 201 at a lower surface of the support unit 203 using screws. A plurality of nozzles 201a are installed at the distributing plate 201 at a certain interval, for example, about 2 mm. The area of the distributing plate 201 is divided into two circular regions. The inner side of the circular region is called a first zone Z1, and the outer side of the circular region is called a second zone Z2. The second heater EW2 is installed at the third passage 201b of the first zone Z1, and the third heater EW3 is installed at the third passage 201b of the second zone Z2. The second and third heaters EW2 and EW3 are connected with the power supply unit PS. In addition, the inlet tube L1 and the outlet tube L4 for flowing fluid therethrough are connected with the third passage 201b. The thermocouplers which are the third and fourth temperature detectors TC3 and TC4 are installed in the first and second zones Z1 and Z2 for measuring the temperature of the distributing plate 201. The entire thickness of the distributing plate 201 is about 20 mm, and the distance between the nozzles is 2 mm. The distributing plate is generally manufactured by a known method such as a die casting method, casting method, braze method, etc.

Figure 6B:
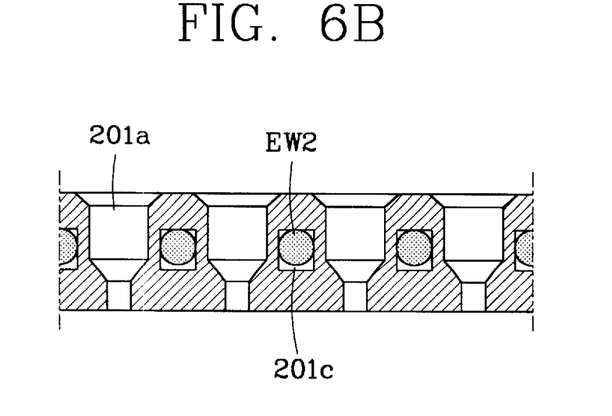
FIG. 6B is a cross-sectional view illustrating a nozzle portion and taken along line VIB—VIB of FIG. 6A.

FIG. 6B is a vertical cross-sectional view taken along line VIB—VIB of FIG. 6A. As shown therein, the nozzle 201a is not linear. Namely, the inner diameter of the nozzle 201a is are different at its upper, intermediate, and lower portions. The upper portion diameter is largest, and the intermediate portion diameter is middle size, and the lower portion diameter is smallest. In addition, the second and third heaters EW2 and EW3 are installed in the third passage 201b.

As shown in FIG. 5, various peripherals are installed outside the gas distributor.

Namely, a fluid control apparatus A which includes fluid flow control apparatuses V1 and V2 such as a pneumatic valve or manual valve, and MFC(Mass Flow Controllers) MFC1 and MFC2 are installed in front of a fluid inlet tube L2 connected with a first passage 204b of the cover 204 of the gas distributor 200 and a fluid inlet tube L1 connected with a third passage 201b of the distributing plate 201 for thereby controlling the fluid flowing into the interior of the gas distributor. Namely, the fluid control apparatus A controls the flowing amount of heated or cooled fluid and flows the same into the interior of the gas distributor in accordance with a set destination temperature.

Figure 7:
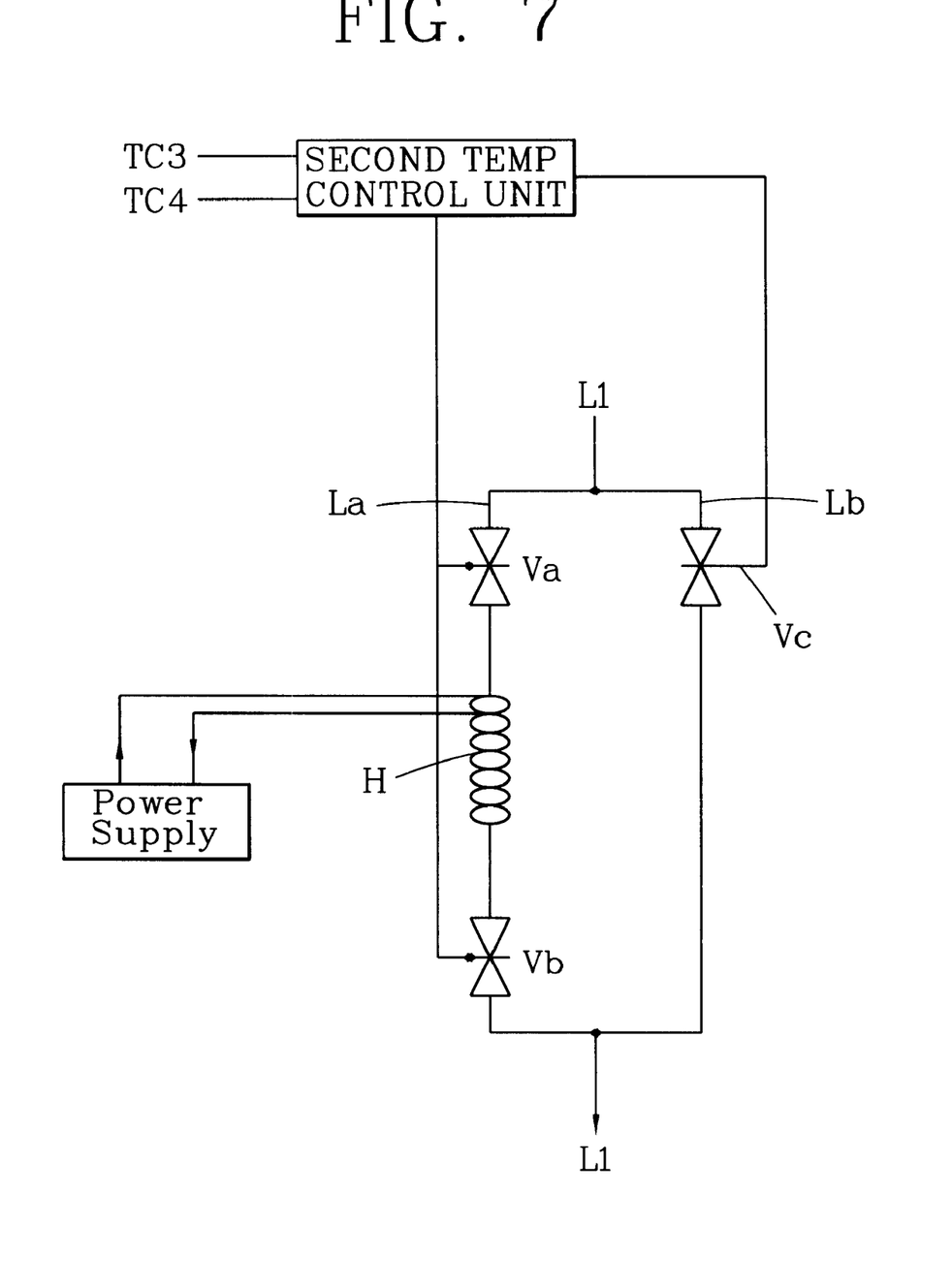
FIG. 7 is a view illustrating a fluid temperature control apparatus according to the present invention.

A fluid temperature control apparatus B having a cooling path Lb and a heating path La as shown in FIG. 7 may be installed at a portion B of the inlet tubes L1 and L2 instead of the fluid control apparatus A.

As shown in FIG. 7, the inlet tubes L1 and L2 are divided into two tubes La and Lb, and two valves Va and Vb are installed in series at the divided tube La, and a line heater H is installed between two valves Va and Vb for thereby forming a heating path La, and the heater is not installed at the remaining divided tube Lb for thereby directly flowing the fluid, or the valve Vc may be installed for blocking the flow of the fluid for thereby forming a cooling path Lb, so that the fluid from the heating path La or the cooling path Lb is flown into the interior of the gas distributor along the inlet tubes L1 or L2.

As shown in FIG. 5, a cooling apparatus 206 is connected with an end portion of the fluid outlet tubes L3 and L4 for cooling the fluid flown from the gas distributor and an outlet tube 207 for discharging the fluid which is flown from the cooling apparatus 206.

In the temperature controllable gas distributor according to the present invention, it is possible to control the temperature in the gas distributor up to 700° C. In addition, the gas distribution apparatus according to the present invention may be well adapted to the chemical vapor deposition apparatus for forming an organic metallic thin film which uses an organic metal as a gas source, in which a temperature control in the gas distributing apparatus affects the formation of the thin film.

The operation of the temperature control of the temperature controllable gas distributor according to the present invention will be explained.

First, the vaporized source gas(hereinafter called vaporized gas) is flown into the interior of the gas distributor via the source gas inlet tube 205. The thusly flown-in vaporized gas is flown onto the wafer W and receives a certain energy for a reaction based on the heat transfer from the heater disposed below the work stand. The source gas reacts on the wafer for thereby forming a thin film on the wafer. At this time, if the heat related environment is bad in the interior of the gas distributor, the vaporized gas abnormally reacts or the vaporized gas may be liquefied, so that the film quality of the thin film formed on the wafer may be decreased, or the deposition speed of the thin film becomes slow. In addition, the above-described abnormal reaction or liquefied gases may cause a formation of particles which pollute the thin film. Therefore, the temperature must be properly controlled for preventing an abnormal reaction or liquefaction of the vaporized gases in the gas distributor.

In the present invention, a fluid circulation portion(first passage) is formed at the cover of the gas distributor for thereby controlling the temperature of the upper portion in the gas distributor, and the fluid is flown to the distributing plate for thereby controlling the temperature of the lower portion in the gas distributor. Namely, the present invention adapts a double temperature control method.

First, the upper portion temperature control of the gas distributor is implemented as follows. The temperature is measured using the first and second temperature detectors TC1 and TC2 installed in the fluid circulation portion(first passage) installed at the cover, and the thusly detected temperature is compared with the destination temperature using a temperature controller(not shown). As a result of the comparison, if the detected temperature does not reach the destination temperature, the fluid heated by the heating path La of the fluid temperature control apparatus B is flown into the fluid circulation portion, namely, the first passage 204b, and the first heater, namely, the electric wire EW1, installed in the second passage is supplied with the power for thereby heating the electric wire EW1. Therefore, the fluid temperature of the first passage 204b is increased up to a certain destination temperature or is constantly maintained based on a heat transfer from the electric wire EW1. The detected temperature is higher than the destination temperature by the first and second temperature detectors TC1 and TC2, the cooled fluid is flown into the first passage 204b via the cooling path Lb of the fluid temperature control apparatus B for thereby constantly maintaining the temperature. In addition, the fluid control apparatus A is installed for controlling the flowing amount of fluid instead of the distributor, namely, the fluid temperature control apparatus B, so that the flowing amount of fluid is controlled by the fluid flowing amount controller and is flown into the first passage 204b. The heated fluid is flown to the outside via the outlet tube L3 for thereby controlling the temperature.

In addition, the temperature of the distributing plate 201 is controlled as follows.

The distributing plate 201 may be easily heated by the heater 102 installed below the work stand 101. When the distributing plate 201 is heated, gases may abnormally react at the upper portion of the distributing plate 201 or may abnormally react when passing through the distributing plate 201 for thereby forming particles, and the thusly formed particles may fall onto the upper surface of the wafer. The thusly fallen particles are accumulated on the upper portion of the distributing plate 201 for thereby blocking the nozzle 201a of the distributing plate 201. If the temperature of the distributing plate 201 is too low, the vaporized gases are liquefied on the distributing plate for thereby polluting the distributing plate 201 or the upper surface of the wafer. Therefore, the distributing plate 201 must have a proper temperature.

The temperature of the distributing plate 201 is detected by the third and fourth temperature detectors TC3 and TC4. As a result of the detection, if it is judged that the distributing plate 201 is over-heated, the fluid is flown into the third passage of the distributing plate 201 via the cooling path Lb of the fluid temperature control apparatus B of the gas inlet tube L1. The heated fluid is flown to the outside via the outlet tube L4. The cooled fluid is flown toward the distributing plate 201 until a proper temperature is detected by the third and fourth temperature detectors TC3 and TC4. The heated fluid is flown to the outside via the outlet tube.

If the temperature detected by the third and fourth temperature detectors TC3 and TC4 is lower than the destination temperature, power is supplied to the electric wires EW2 and EW3 for thereby heating the fluid in the third passage 201b of the distributing plate 201. Therefore, it is possible to maintain a proper temperature of the distributing plate 201.

As described above, in the temperature controllable gas distributor according to the present invention, since the temperature is controlled on the upper(cover) and lower (distributing plate) portions of the gas distributor, namely, the entire portions contacting with gases in the gas distributor, it is possible to obtain a stable and uniform temperature distribution of the source gas in the gas distributor, so that an abnormal reaction and liquefaction of the source gas is prevented.

In addition, it is possible to form a uniform thin film on a wafer based on a stable and uniform temperature, so that a reliability of a semiconductor device is enhanced using the thusly formed thin film.

Since the reproducibility in a thickness and growing speed of a thin film formed on a wafer is enhanced based on a stable and uniform temperature, so that a fabrication yield of the semiconductor device is stabilized.

Since an abnormal reaction and a liquefaction of gas are prevented, it is possible to prevent a pollution of gas distributor for thereby increasing a system operation rate based on an extended rinsing interval of the apparatus and enhancing the productivity.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. A temperature controllable gas distributor apparatus, comprising:

a cover, having an uppermost portion and a lowermost portion, wherein a first fluid passage is formed between the uppermost and lowermost portions;

a distributing plate attached below the covet and having a plurality of nozzles for distributing gas, wherein said nozzles have an uppermost portion diameter, an intermediate portion diameter, and a lowermost portion diameter which are different from each other and wherein the uppermost portion diameter is largest, and the lowermost portion diameter is smallest;

at least one temperature sensor installed in the first fluid passage and configured to detect a temperature of a fluid in the first fluid passage;

an inlet tube connected to the first fluid passage for admitting a fluid into the first fluid passage;

an outlet tube connected to the first fluid passage for capturing fluid flowing out of the first fluid passage, wherein a second passage is formed enclosed within edge portions of the uppermost portion of the cover, and wherein a first heater wire is disposed in the second passage and is configured to selectively heat the cover;

a third passage in the distributing plate connected to a source of fluid for flowing the fluid through the third passage; and a second heater wire is disposed in the third passage.

2. The apparatus of claim 1, further comprising a cooling unit that is coupled to an end portion of the outlet tube.

3. The apparatus of claim 1, wherein the second passage is ring-shaped.

4. The apparatus of claim 3, further comprising a fluid temperature control apparatus coupled to the inlet tube wherein the fluid temperature control apparatus is configured to control a temperature of a fluid in the inlet tube.

5. The apparatus of claim 4, wherein said fluid temperature control apparatus comprises:

a heating tube coupled to the inlet tube;

a first valve and a second valve installed in series on the heating tube;

a line heater attached to the heating tube and installed between the first and second valves;

a cooling tube coupled to the inlet tube; and a third valve installed on the cooling tube.

6. The apparatus of claim 5, wherein when a fluid temperature detected by the at least one temperature sensor is higher than a predetermined temperature, the first and second valves are shut and the third valve is opened such that a fluid will flow into the first passage via the cooling tube; and wherein when a fluid temperature detected by the at least one temperature sensor is below a predetermined temperature, the third valve is closed, and the first and second valves are opened so that a fluid will flow into the first passage via the heating tube.

7. The apparatus of claim 6, wherein when a temperature sensed by the at least one temperature sensor is below a predetermined temperature, power is supplied to the first heater wire in the second passage to heat a fluid in the first fluid passage.

8. The apparatus of claim 5, wherein when a temperature detected by the at least one temperature sensor is lower than a predetermined temperature, a fluid flowing into the first passage is routed via the heating tube.

9. The apparatus of claim 1, further comprising:
a distributing plate passage formed in the distributing plate; and
a second heater wire installed in the distributing plate passage of the distributing plate.

10. The apparatus of claim 9, wherein at least one temperature sensor is installed at the distributing plate and is configured to sense a temperature of the distributing plate.

11. The apparatus of claim 10, wherein said at least one temperature sensor installed in the distributing plate comprises a thermocouple.

12. The apparatus of claim 9, further comprising:
an inlet tube, coupled to the distributing plate passage in the distributing plate, and configured to supply a fluid to the distributing plate passage; and
a fluid temperature control apparatus coupled to the inlet tube connected with the distributing plate passage and configured to control a temperature of a fluid flowing into the distributing plate passage.

13. The apparatus of claim 12, wherein said fluid temperature control apparatus comprises:
a heating tube coupled to the inlet tube connected to the distributing plate passage;
a first valve that controls fluid flow through the heater tube;
a heater mechanism attached to the heater tube; p1 a cooling tube coupled to the inlet tube; and
a second valve that controls fluid flow through the cooling tube.

14. The apparatus of claim 13, wherein when a temperature detected by the at least one temperature sensor installed in the distributing plate is higher than a predetermined temperature, and the fluid temperature control apparatus causes fluid flowing into the inlet tube to pass through the cooling tube.

15. The apparatus of claim 13, wherein when a temperature detected by at least one temperature sensor installed in the distributing plate is lower than a predetermined temperature, the fluid temperature control apparatus causes fluid flowing into the inlet tube to pass through the heater tube.

16. The apparatus of claim 15, wherein when a temperature sensed by the at least one temperature sensor in the distribution plate is below a predetermined temperature, power is supplied to the heater wire installed in the distributing plate passage of the distributing plate.

17. The apparatus of claim 1, further comprising a fluid control apparatus having a fluid flowing amount controller coupled to the inlet tube connected with the first passage.

18. The apparatus of claim 1, further comprising a second heater wire in the distributing plate, wherein the second heater wire is formed within a third passage and the third passage is formed near the intermediate portion of at least one of the plurality of nozzles.

19. The apparatus of claim 1, further comprising a second heater wire in the distributing plate between at least two of the plurality of nozzles.

20. A gas distributor, comprising:
a cover member, comprising:
a fluid inlet,
a fluid outlet,
a fluid passage that passes through the cover member and that connects the fluid inlet to the fluid outlet, and
a gas inlet, wherein the cover member is configured such that a fluid passing through the fluid passage can be used to alter a temperature of a gas flowing into the gas inlet;
a temperature detector installed in the cover member and configured to detect a temperature of a fluid in the fluid passage;
a distributing plate attached to a lower surface of the cover member, wherein the distributing plate includes a plurality of nozzles for ejecting a gas and a heater wire in the distributing plate, wherein selective application of electrical power to the heater wire can be used to alter a temperature of a gas passing through the nozzles; and
a distributing plate fluid passage in the distributing plate connected to a source of fluid for flowing fluid through the distributing plate fluid passage, wherein the heater wire is located in the distributing plate fluid passage.

21. The gas distributor of claim 20, wherein the cover member further includes a heater wire, and wherein selective application of electrical power to the heater wire can be used to alter a temperature of a gas flowing into the gas inlet.

22. The gas distributor of claim 20, further comprising a fluid flow controller connected to the temperature detector, wherein the fluid flow controller is configured to vary an amount of fluid flowing into the inlet of the cover member based on a signal from the temperature detector that is indicative of a temperature of fluid in the cover member.

23. The gas distributor of claim 22, wherein the fluid flow controller is also configured to vary a temperature of fluid flowing into the inlet of the cover member based on a signal from the temperature detector that is indicative of a temperature of fluid in the cover member.

24. The gas distributor of claim 20, further comprising a fluid flow controller connected to the temperature detector, wherein the fluid flow controller is configured to vary a temperature of fluid flowing into the inlet of the cover member based on a signal from the temperature detector that is indicative of a temperature of fluid in the cover member.

25. The gas distributor of claim 20, further comprising a distributing plate passage located near the nozzles in the distributing plate, wherein the heater wire is located within the distributing plate passage.

26. The gas distributor of claim 20, wherein the distributing plate comprises:
a fluid inlet;
a fluid outlet; and
a fluid passage that passes through the distributing plate and that connects the fluid inlet to the fluid outlet, wherein the distributing plate is configured such that fluid passing through the fluid passage in the distributing plate can be used to alter a temperature of a gas passing through the nozzles.

27. The gas distributor of claim 26, further comprising a temperature detector installed in the distributing plate and configured to detect a temperature of the distributing plate.

28. The gas distributor of claim 27, further comprising a fluid flow controller connected to the temperature detector installed in the distributing plate, wherein the fluid flow controller is configured to vary an amount of fluid flowing into the inlet of the distributing plate based on a signal from the temperature detector that is indicative of a temperature of fluid in the fluid passage of the distributing plate.

29. The gas distributor of claim 27, further comprising a fluid flow controller connected to the temperature detector installed in the distributing plate, wherein the fluid flow controller is configured to vary a temperature of fluid flowing into the inlet of the distributing plate based on a signal from the temperature detector that is indicative of a temperature of fluid in the fluid passage of the distributing plate.

30. The gas distributor of claim 26, further comprising a fluid flow controller coupled to the fluid inlet of the distributing plate and configured to control a temperature of a fluid flowing into the fluid inlet of the distributing plate, the fluid flow controller comprising:
- a heater pipe coupled to the fluid inlet of the distributing plate;
- a heater pipe flow valve coupled to the heater pipe and configured to control a fluid flow through the heater pipe;
- a cooling pipe coupled to the fluid inlet of the distributing plate;
- a cooling pipe flow valve coupled to the cooling pipe and configured to control a fluid flow through the cooling pipe; and
- a controller coupled to the temperature detector installed in the distributing plate, the heater pipe control valve and the cooling pipe control valve, wherein the controller is configured to selectively open and close the heating pipe control valve and the cooling pipe control valve in response to a signal from the temperature detector.

31. The gas distributor of claim 20, further comprising a fluid flow controller coupled to the fluid inlet of the cover member and configured to control a temperature of a fluid flowing into the fluid inlet of the cover member, the fluid flow controller comprising:
- a heater pipe coupled to the fluid inlet of the cover member;
- a heater pipe flow valve coupled to the heater pipe and configured to control a fluid flow through the heater pipe;
- a cooling pipe coupled to the fluid inlet of the cover member;
- a cooling pipe flow valve coupled to the cooling pipe and configured to control a fluid flow through the cooling pipe; and
- a controller coupled to the temperature detector, the heater pipe control valve and the cooling pipe control valve, wherein the controller is configured to selectively open and close the heating pipe control valve and the cooling pipe control valve in response to a signal from the temperature detector.

32. The gas distributor of claim 20, wherein the heater wire is between at least two of the plurality of nozzles.

* * * * *